United States Patent [19]
Lacap

[11] Patent Number: 5,939,781
[45] Date of Patent: Aug. 17, 1999

[54] THERMALLY ENHANCED INTEGRATED CIRCUIT PACKAGING SYSTEM

[75] Inventor: Efren M. Lacap, Tustin, Calif.

[73] Assignee: Texas Instruments Incorporated, Dallas, Tex.

[21] Appl. No.: 08/721,138

[22] Filed: Sep. 26, 1996

[51] Int. Cl.$^6$ .................. H01L 29/40; H01L 23/48; H01L 23/50
[52] U.S. Cl. .................. 257/698; 257/692; 257/693; 257/697; 257/712; 257/707
[58] Field of Search .................. 257/690, 675, 257/692–698, 706, 707, 712, 713, 717, 730

[56] References Cited

U.S. PATENT DOCUMENTS

| | | | |
|---|---|---|---|
| 4,392,152 | 7/1983 | Hirano | 257/695 |
| 4,989,066 | 1/1991 | Sumi | 257/692 |
| 5,281,849 | 1/1994 | Singh Deo et al. | 257/693 |
| 5,334,872 | 8/1994 | Ueda et al. | 257/717 |
| 5,384,286 | 1/1995 | Hirai | 257/717 |
| 5,394,751 | 3/1995 | Ishibashi | 257/696 |

FOREIGN PATENT DOCUMENTS

| | | | |
|---|---|---|---|
| 2-138761 | 5/1990 | Japan | 257/675 |
| 3-95959 | 4/1991 | Japan | 257/675 |
| 3-105958 | 5/1991 | Japan | 257/675 |
| 5-152485 | 6/1993 | Japan | 257/694 |

*Primary Examiner*—Tom Thomas
*Assistant Examiner*—Alexander Oscar Williams
*Attorney, Agent, or Firm*—W. Daniel Swayze, Jr.; W. James Brady, III; Richard L. Donaldson

[57] ABSTRACT

The present invention is a thermally enhanced integrated circuit packaging system that can be produced using standard assembly tooling and equipment and that provides increased heat dissipation with little or no additional cost. The present invention provides novel enhanced internal and external thermal pathways from the die to the ambient. In one embodiment, unused and grounded leads are joined internally by webs between individual leads, forming a wide heat conduction path which is directly connected to the die pad. This heat conduction path enhances heat flow from the die to the exterior of the integrated circuit package. In addition, a second set of webs joins the leads at their exterior ends, providing an enhanced thermal path externally from the integrated circuit package to the printed circuit board, and from there to the ambient environment. In another embodiment of the invention, heat dissipation from the integrated circuit package is further enhanced by mounting it on a printed circuit board comprising a ground plane to which the webbed external leads are directly connected. Because of the increased heat transfer between the integrated circuit die and the printed circuit board provided by the present invention, the ground plane on the printed circuit board acts as a heat sink, dissipating heat conducted to the ground plane through the webbed leads. The present invention is fabricated using the same tools and equipment as standard, unenhanced integrated circuit packaging.

13 Claims, 5 Drawing Sheets

THERMALLY ENHANCED INTEGRATED CIRCUIT PACKAGING SYSTEM

BACKGROUND OF THE INVENTION

1. Field of the Invention

The present invention relates generally to integrated circuit packaging, and more particularly to a thermally enhanced packaging system for thin film integrated circuits.

2. Background Art

An integrated circuit dissipates power primarily in the form of heat. Typical semiconductor devices have an ambient operating temperature range from 0 to 70 degrees Celsius, although some devices have ambient operating temperatures beyond this range. The temperature of the semiconductor substrate depends upon the heat generating characteristics of the integrated circuit components, the heat dispersive properties of the packaging, and the ambient temperature of the surrounding environment. As the temperature of the semiconductor substrate approaches the high temperature operating limit of the semiconductor device, the performance of the semiconductor device substantially degrades. High temperature operation of a semiconductor device reduces its operating lifespan, causes it to operate at slower speeds, and causes it to display other non-ideal operating characteristics.

Semiconductor devices are often required to dissipate significant amounts of power to perform useful functions. Power, dissipated in the form of heat, travels by conduction through the semiconductor substrate into a plastic molding or other case or packaging enclosing the device. As advances in integration techniques continue to reduce the physical size of semiconductor devices, the size of integrated circuit packaging is reduced as well. Smaller enclosures have less mass to absorb heat and less surface to radiate heat away from the semiconductor device. Thus higher circuit integration requires greater relative power dissipation from smaller integrated circuit packages.

Heat dissipation from integrated circuit packages can be enhanced by means of externally mounted metallic heat sinks. Such heat sinks are typically made of aluminum or aluminum alloy and are attached to the top surface of a molded plastic integrated circuit package by mechanical means or with a thermally conductive adhesive.

Although externally mounted heat sinks can significantly enhance the heat dissipation of an integrated circuit package, external heat sinks are not suitable for many applications. External heat sinks substantially increase the dimensions of an integrated circuit package. In applications where components are closely aligned or the system chassis is closely fitted, external heat sinks complicate design efforts and often result in wasted space.

Heat dissipation from an integrated circuit package may also be increased by internal means. The bulk of an integrated circuit package consists of plastic, a thermal insulator. The heat dissipated by the integrated circuit chip encapsulated in the molded plastic package can be enhanced by providing additional thermal pathways from the integrated circuit chip to the ambient environment.

A standard, non-thermally enhanced molded plastic integrated circuit package is shown in FIGS. 1, 2 and 3. As shown in FIG. 1, integrated circuit package 105 consists of a molded plastic body 100 containing an integrated circuit die 110 mounted to a die pad 120, a leadframe 130, and bond wires 140 electrically connecting die 110 to the leads of leadframe 130. A plan view of die pad 120 and leadframe 130 is shown in FIG. 2. As shown in FIG. 2, die pad 120 consists of a rectangular substrate. Leadframe 130 consists of a series conductive strips extending radially outward adjacent to die pad 120. Leadframe 130 and die pad 120 are separated by a gap 200 around the perimeter of die pad 120. Gap 200 is also shown in FIG. 1. As shown in FIG. 1, bond wires 140 form an electrical connection across gap 200 between die 110 and the individual leads making up leadframe 130. Bond wires 140 are usually very thin. Accordingly, although they conduct heat as well as electricity, because of their small diameter, their thermal resistivity is relatively high.

FIG. 3 is a top view of integrated circuit package 105. FIG. 3 shows how the ends of the individual leads 300 of leadframe 130 extend from integrated circuit package 105. Leads 300 form the pins used to make electrical connections from the integrated circuit to external circuitry. As shown in FIG. 1, leads 300 typically have a downset 135. Downset is a dogleg bend that brings ends 145 of individual leads 300 below the level of the bottom of molded body 100 to facilitate mounting of integrated circuit package 105 to a printed circuit board.

FIG. 4 illustrates an integrated circuit package 405 with an integrated heat sink 410. As shown in FIG. 4, the lower half of integrated circuit package 405 includes a molded plastic body 400 containing a die 110, lead frame 130, and bond wires 140. Integrated circuit package 405 does not include a die pad. The upper part of integrated circuit package 405 incorporates a heat sink 410 separated by double sided, thermally conductive/electrically insulative tape 415 from die 110. Integrated circuit package 405 provides greater heat dissipation than standard integrated circuit package 105. However, integrated circuit package 405 is significantly more difficult and costly to produce. Because the leadframe and heat sink have to be tooled separately, the cost of integrated circuit package 405 is three to five times that of unenhanced integrated circuit package 105.

FIG. 5 illustrates an integrated circuit package with an internal heat spreader. As shown in FIG. 5, this type of integrated circuit package 505 contains an internal heat spreader 500 in addition to die 110, die pad 120, leadframe 130, bond wire 140 and package body 100. Internal heat spreader 500 is typically made of aluminum and may or may not be in thermal contact with the leadframe. In the package shown in FIG. 5, heat spreader 500 is not in contact with leadframe 130.

Heat spreader 500 has "legs" 510 on which it stands when placed into a mold. As plastic mold compound is injected into the mold, it raises heat spreader 500 such that it contacts the underside of die pad 120. In the finished package, mold body 100 completely encompasses heat spreader 500.

Internal heat spreaders such as heat spreader 500 are used in the thicker integrated circuit packages such as plastic leadless chip carriers (PLCC's) and plastic dual in-line pin packages (PDIP's).

Internal heat spreader 500 exhibits some of the same disadvantages as an external heat sink. Because heat spreader 500 is encapsulated in plastic molded body 100, it is insulated from the ambient air by the molded body 100's high thermal resistivity. The high resistivity of molded body 100 prevents heat from being dissipated effectively. In addition, because heat spreader 405 is contained entirely within package 505, package 505 is thicker than a similar package that does not include a heat spreader.

Integrated circuit packages incorporating heat spreaders in thermal contact with the lead frame are shown in FIGS. 6 and 7.

Integrated circuit package 605 shown in FIG. 6, like integrated circuit package 505 of FIG. 5, consists of molded body 100, die 110, die pad 120, leadframe 130, and bond wires 140. Integrated circuit package 605 also contains a heat spreader 600 that extends beyond die pad 120 such that it is in thermal contact with leadframe 130. Double sided thermally conductive/electrically insulative tape 610 is disposed between heat spreader 600 and leadframe 130 to allow heat conduction but provide electrical insulation between heat spreader 600 and leadframe 130.

Integrated circuit package 705 shown in FIG. 7 is similar to integrated circuit package 605 of FIG. 6, incorporating a molded body 100, die 110, leadframe 130, bond wires 140, heat spreader 700 and double sided thermally conductive/electrically insulative tape 710 disposed between heat spreader 700 and leadframe 130. However, integrated circuit package 705 does not include a die pad 120. Instead, die 110 is supported by heat spreader 700.

While heat spreader integrated circuit packages 605 and 705 need not be as thick as drop-in heat spreader integrated circuit package 505, they are more expensive to produce, costing one and one half to two times as much as unenhanced integrated circuit package 105.

FIG. 8 illustrates an integrated circuit package 805 incorporating a "bat-wing" leadframe 810. As shown in FIG. 8, in a bat-wing leadframe integrated circuit package, the thermal path between die pad 120 and one or more leads 815 is enhanced by a bat-wing shaped conducting surface 820 that forms an enlarged thermal path between die pad 120 and the upper ends 825 of leads 815. In FIG. 8 molded package body 100 has been cut away to expose conducting surface 820. In the actual package, molded body 100 encapsulates and covers conducting surface 820. Accordingly, conducting surface 820 provides increased heat conduction only within molded body 100 from die pad 120 to the upper ends 825 of leads 815. The remainder of the thermal path from upper ends 825 of leads 815 to the tips of leads 815 is restricted by the smaller cross section of the leads 815 themselves. Accordingly, heat conduction to a circuit board via leads 815 and from there to the ambient environment remains limited.

There remains a need for an integrated circuit package that provides enhanced heat dissipation with little or no added cost.

SUMMARY OF THE INVENTION

The present invention is a thermally enhanced integrated circuit packaging system that can be produced using standard assembly tooling and equipment and that provides increased heat dissipation with little or no additional cost. The present invention provides novel enhanced internal and external thermal pathways from the die to the ambient environment. In one embodiment, unused and grounded leads are joined internally by webs between individual leads, forming a wide heat conduction path which is directly connected to the die pad. This heat conduction path enhances heat flow from the die to the exterior of the integrated circuit package. In addition, a second set of webs joins the leads at their exterior ends, providing an enhanced thermal path externally from the integrated circuit package to the printed circuit board, and from there to the ambient environment. In another embodiment of the invention, heat dissipation from the integrated circuit package is further enhanced by mounting it on a printed circuit board comprising a ground plane to which the webbed external leads are directly connected. Because of the increased heat transfer between the integrated circuit die and the printed circuit board provided by the present invention, the ground plane on the printed circuit board acts as a heat sink, dissipating heat conducted to the ground plane through the webbed leads. The present invention is fabricated using the same tools and equipment as standard, unenhanced integrated circuit packaging. Accordingly, the present invention can be fabricated with little or no additional cost over standard, non-thermally enhanced integrated circuit packaging.

DETAILED DESCRIPTION OF THE INVENTION

A novel, heat dissipation enhancing integrated circuit packaging system is disclosed. In the following description, numerous specific details such as materials, shapes, layouts, mounting and fabrication methods, etc. are described in detail in order to provide a thorough description of the present invention. It will be apparent to one skilled in the art, however, that the invention may be practiced without these specific details. In other instances, well-known features have not been described in detail so as not to obscure the present invention unnecessarily.

Figure 9:
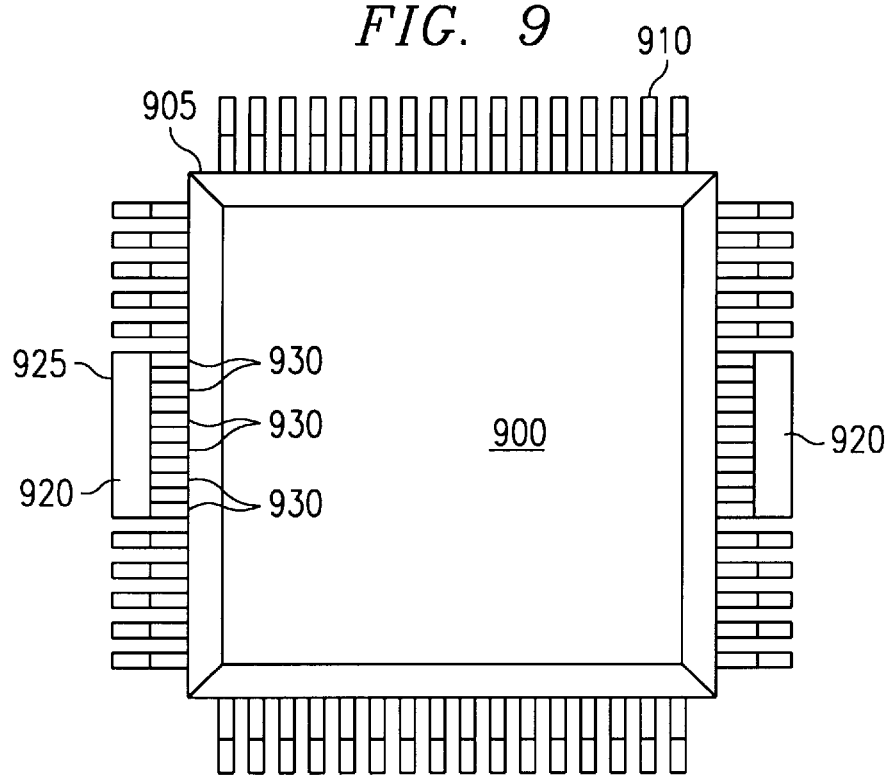
FIG. 9 is a top view of one embodiment of an integrated circuit package of the present invention.
Figure 10:
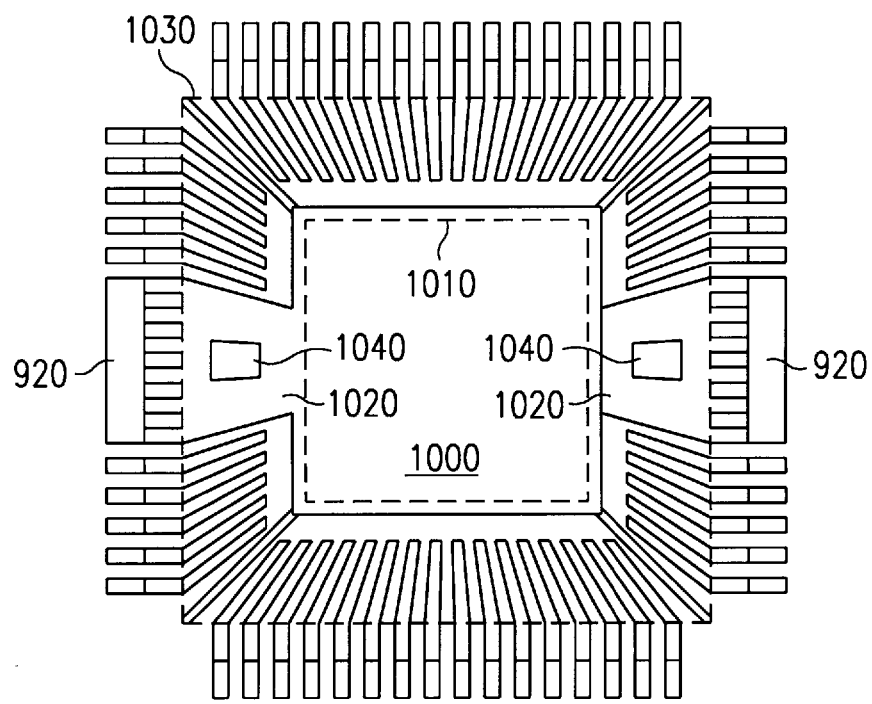
FIG. 10 is a top cross-sectional view of the embodiment of FIG. 9.

One embodiment of a thermally enhanced integrated package of the present invention is shown in FIGS. 9 and 10. In this embodiment, the invention is used with a 64-pin Thin Quad Flatpack Package (TQFP). FIG. 9 is a top view of the exterior of a 64-pin TQFP integrated circuit package 905 according to the present invention. As shown in FIG. 9, the visible exterior portions of this embodiment include plastic molded body 900 and pins 910 that extend outward from the perimeter of molded body 900. As this embodiment is a 64-pin package, there are 16 pins on each of the four sides of molded body 900. Integrated circuit package 905 also includes webs 920 that join a number of pins 910. These pins are identified as pins 930 in FIG. 9. In the embodiment shown in FIG. 9, there are two webs 920 on opposite sides of molded body 900. Each web joins six pins 930. Webs 920, like pins 930, are typically made of a metal conductor such as a copper alloy. Each group of pins 930 connected by a web 920 typically consist of unused and ground leads. Other pins 910 that can be electrically connected together without impeding operation of the integrated circuit may also be joined by a web 920. In the embodiment of FIG. 9, pins 910 have a standard downset, and web 920 extends horizontally from the outer ends 925 of pins 930 to the bottom of the upwards vertical bend in the downset. In the embodiment shown in FIG. 9, a total of 12 pins 910 are joined together by webs 920, leaving 52 pins available for input/output connections to the integrated circuit die.

Web 920 increases the heat dissipation from pins 930 by increasing the surface area for heat transfer from pins 930 to the ambient environment. This ambient environment may include a printed circuit board to which integrated circuit package 905 is mounted as well as the surrounding air.

In addition to providing enhanced heat transfer from pins 930 to the ambient environment, the present invention also provides increased heat transfer from the integrated circuit die to pins 930. FIG. 10 illustrates the enhanced thermal pathway from an integrated circuit die to web 920 in one embodiment of the present invention.

As shown in FIG. 10, in this embodiment of the present invention, a wide heat transfer channel 1020 thermally connects pins 930 to die pad 1000. Although FIG. 10 shows a particular configuration for heat transfer channel 1020, heat transfer channel 1020 can have a variety of other shapes and configurations. In the embodiment shown in FIG. 10, heat transfer channel 1020 consists of a flat, tapered, metal layer with a cut-out portion 1040. During the molding process, cut-out portion 1040 is filled with molding material, anchoring heat transfer channel 1020 to the molded package In FIG. 10, outline 1030 indicates the limits of the plastic molding 900 of FIG. 9, and outline 1010 indicates the location of the integrated circuit die on die pad 1000. As illustrated in FIG. 10, heat transfer channel 1020 is disposed within plastic molding 900. By not extending beyond plastic molding 900, standard tooling and fabrication techniques can be used. Like web 920 and pins 930, heat transfer channel 1020 is typically made of a metal conductor, such as a copper alloy. Heat transfer channel 1020 forms a thermally conductive path between die pad 1000 and the top of pins 930. The combination of heat transfer channel 1020 and web 920 provides significantly greater heat dissipation from die 900 to the ambient environment than standard packages, without increasing package size and cost.

In the embodiment of an integrated circuit package shown in FIGS. 9 and 10, twelve out of the 64 pins of the 64 pin package are used to provide the enhanced thermal path of the present invention, leaving 52 pins for active input/output. In other embodiments, a greater or lesser number of pins can be used to provide the enhanced thermal path. For example, if an integrated circuit requires 56 active input/output pins, eight pins of a 64-pin TQFP package are available to be used to form an enhanced thermal path. Using eight pins for heat transfer instead of the twelve used in the embodiment of FIG. 10 will reduce heat dissipation to the ambient environment. One way to increase the heat dissipation when a large number of active pins are required is to use a next larger size integrated circuit package layout. For example, a next larger size of TQFP is an 80-pin TQFP. If an integrated circuit requires, for example, 56 active pins, an 80-pin TQFP would leave 24 pins available for use with the heat dissi-pation enhancing features of the present invention, as compared to the 8 pins a 64-pin TQFP would leave available. Although an 80-pin TQFP is somewhat larger (in plan area) than a 64-pin TQFP and is slightly more expensive to produce, the increased amount of heat dissipation that may be provided will in some situations make the use of an 80-pin TQFP instead of a 64-pin TQFP desirable.

In addition to being used with 64-pin and 80-pin TQFP packages, the present invention can be used with other integrated circuit package configurations, including for example, without limitation, Very Small Outline Package (VSOP), Very Thin Quad Flatpack Package (VTQFP), Very Thin Small Outline Package (VTSOP), Thin Shrink Small Outline Package (TSSOP), and Ultra Thin Quad Flatpack Package (UTQFP).

In the embodiment shown in FIGS. 9 and 10, two webs 920 are shown, each situated along the middle of opposite sides of molded body 900. Furthermore, each web 920 is shown as joining six pins 930. The webs 920 need not be located at these position, they can join more or less leads 930, and there can be more or less than the two webs 920 shown in FIG. 9. The minimum number of leads joined by a web 920 is two. Accordingly, the theoretical maximum number of webs 920 for a 64-spin TQFP is 32 webs, each of which joins two leads. The maximum number of leads joined by web 920 would be all 64 leads. The same considerations apply to heat transfer channel 1020. It can join anywhere from two pins 930 on up, and there can be as little as one or as many as 32 heat transfer channels 1020 in a 64-pin TQFP package. Further, although, in the embodiment of FIG. 10, webs 920 join the same pins as are joined by heat transfer channels 1020, webs 920 and heat transfer channels 1020 need not necessarily join the same pins or the same number of pins.

Figure 11:
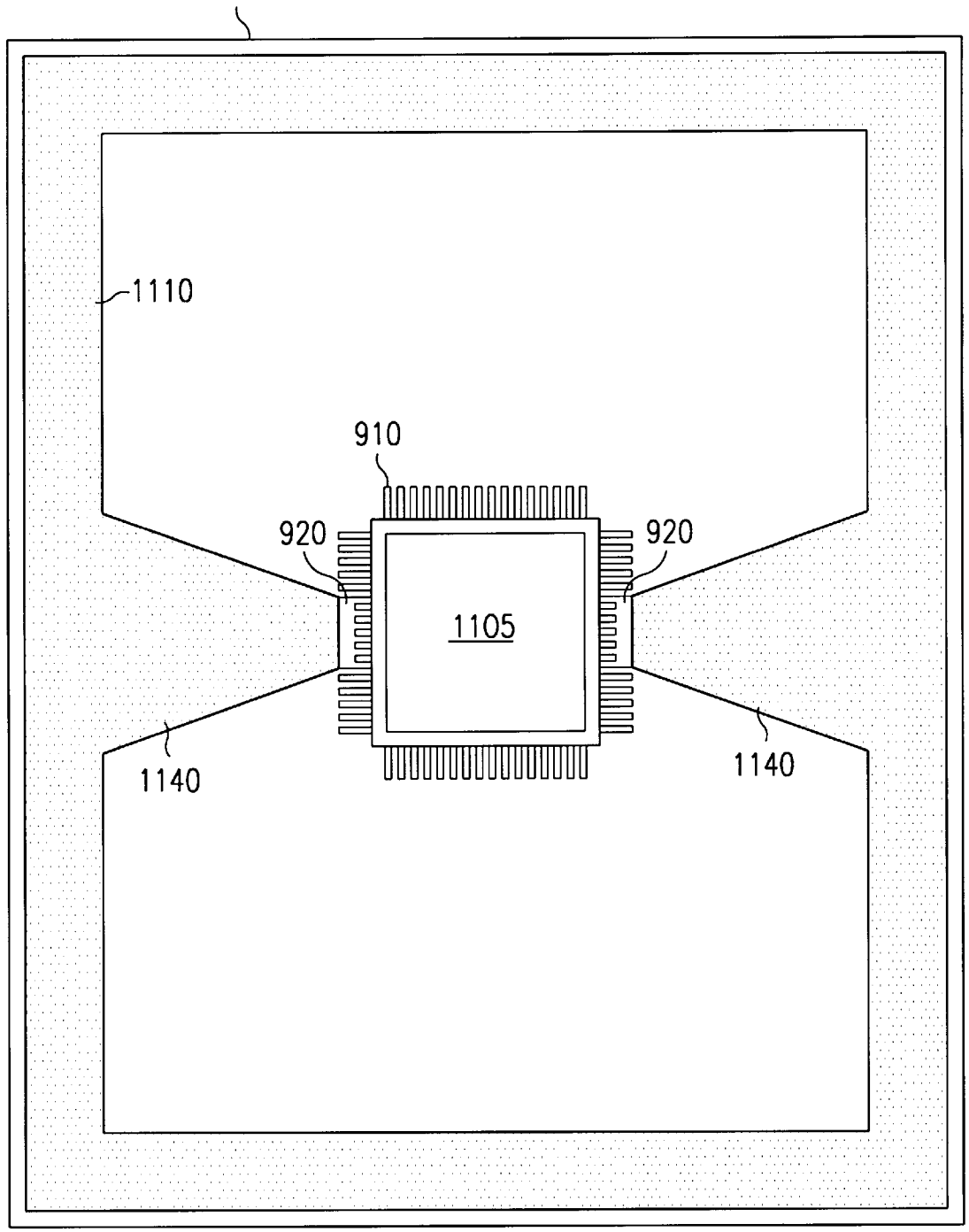
FIG. 11 is a top view of one embodiment of the thermally enhanced packaging system of the present invention utilizing a printed circuit board ground plane heat radiator.

FIG. 11 shows how the thermally enhanced packaging of the present invention can be used in conjunction with a heat dissipative trace surface formed on a printed circuit board to provide an effective heat dissipation system. FIG. 11 shows an integrated circuit device of the present invention mounted on printed circuit board 1100. Printed circuit board 1100 can be any of the printed circuit board types known in the art. For example, printed circuit board 1100 may be a copper clad fiberglass printed circuit board having a fiberglass substrate with etched copper alloy circuit traces on its surface. In the embodiment shown in FIG. 11, one of the circuit traces on the surface of printed circuit board 1100 is a heat dissipative trace 1110, indicated by cross-hatching in FIG. 11. Heat dissipative trace 1110 typically features an expanded surface area compared to standard traces used only for electrical interconnection between components. In the embodiment of FIG. 11, heat dissipative trace 1110 forms an expanded ground trace—that is, it forms an electrical ground. In this embodiment, therefore, heat disspative trace 1110 can be viewed as a ground plane. However, heat dissipative trace 1110 need not be connected to ground, need not have the shape shown in FIG. 11, and need not constitute a single interconnected trace. For example, dissipative trace 1110 may consist isolated trace "islands" each of which is connected to a web 920, as described below. Printed circuit board 1100 ordinarily would contain additional traces, including traces forming connections between active pins 910 of integrated circuit device 1105 and other components. For clarity, these other traces are not shown in FIG. 11.

In the embodiment of FIG. 11, heat dissipative trace 1110 consists of a wide band around the perimeter of circuit board 1100 with two inwardly projecting portions 1140. Webs 920 of integrated circuit device 1105 are thermally and electrically connected, for example by soldering, to the tips of projections 1140 as shown in FIG. 11. The surface of heat dissipative trace 1110 forms an effective heat radiative surface. The solder connection of heat dissipative trace 1110 to webs 920 completes an effective heat conductive path from the diepad of integrated circuit device 1105 to heat dissipative trace 1110. The combination of heat dissipative trace 1110 and the enhanced thermal transfer provided by heat transfer channel 1020 (of FIG. 10) and webs 920 creates a highly effective heat dissipator requiring no external heat sinks and no specialized tooling or fabrication methods.

Printed circuit board 1100 may be a multilayer printed circuit board, with traces on an opposite surface from a surface on which integrated circuit device 1105 is mounted, and may also have traces sandwiched between multiple layers of non-conductive printed circuit board substrate. In addition to or instead of heat dissipative trace 1110 on the same surface on which integrated circuit device 1105 is mounted, printed circuit board 1100 may include an additional heat dissipative trace surface on the opposite surface of printed circuit board 1100. In this case, tinned or soldered through holes would provide a thermal conduit from webs 920 to the heat disspative trace on the opposite surface of printed circuit board 1100, and to traces in intermediate layers.

The leadframe of integrated circuit device 1105 of FIG. 11 may be formed without a downset to facilitate mounting on printed circuit board 1100. In this case, the die wafer may be background such that the die thickness is approximately 10 mils, as compared to a die thickness of approximately 13.5 mils in other TQFP packages.

Figure 1:
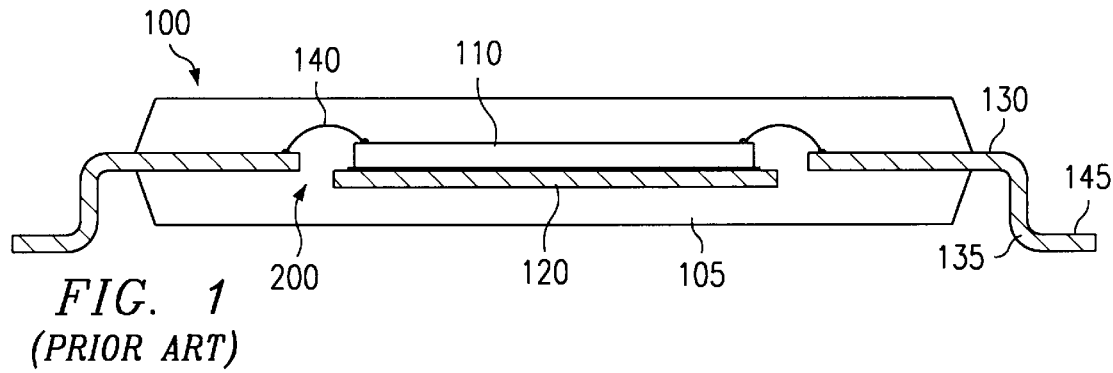
FIG. 1 is a side cross-sectional side view of a standard, unenhanced integrated circuit package of the prior art.
Figure 2:
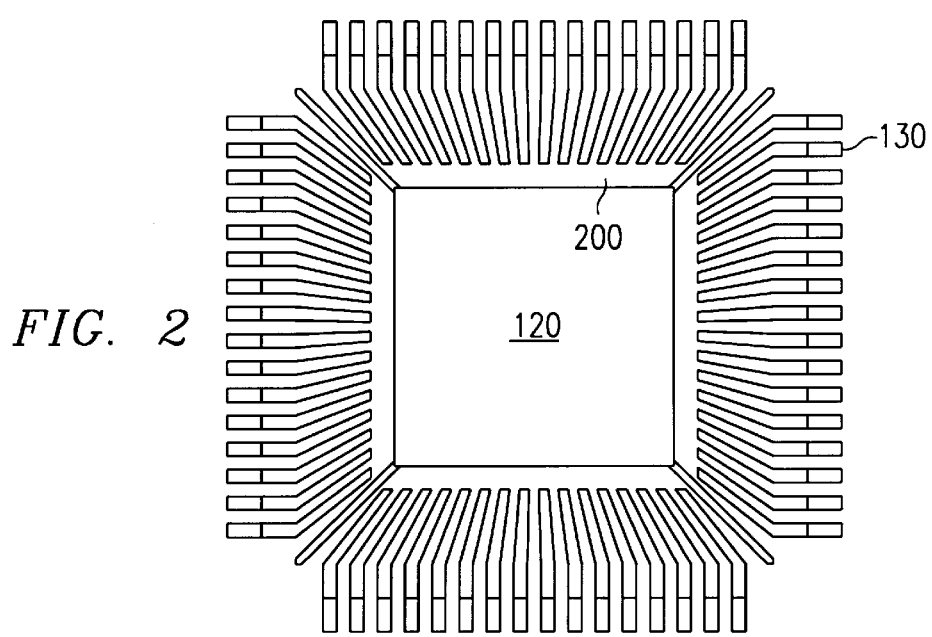
FIG. 2 is a top cross-sectional view of the integrated circuit package of FIG. 1.
Figure 3:
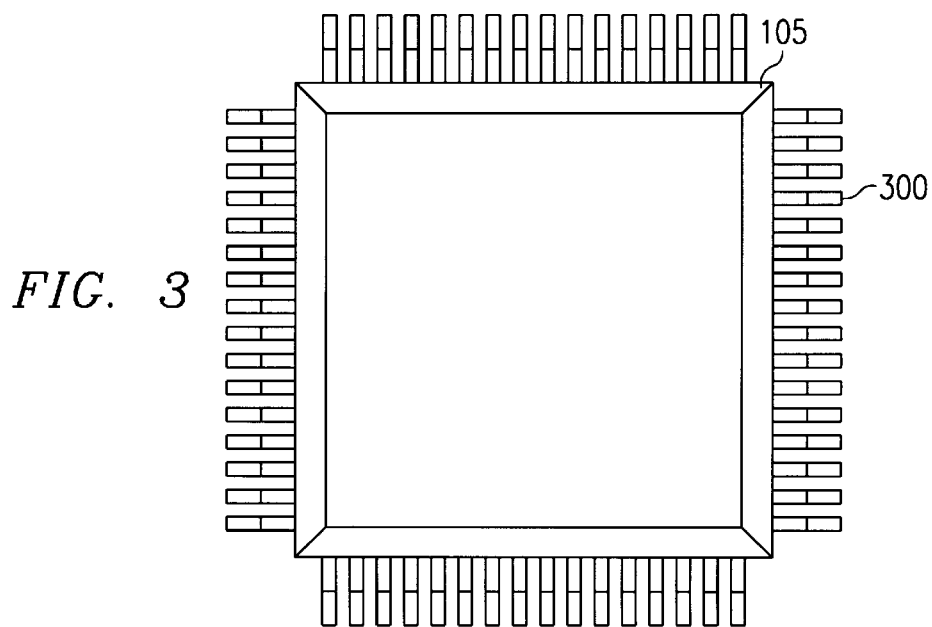
FIG. 3 is a top view of the integrated circuit package of FIG. 1.
Figure 4:
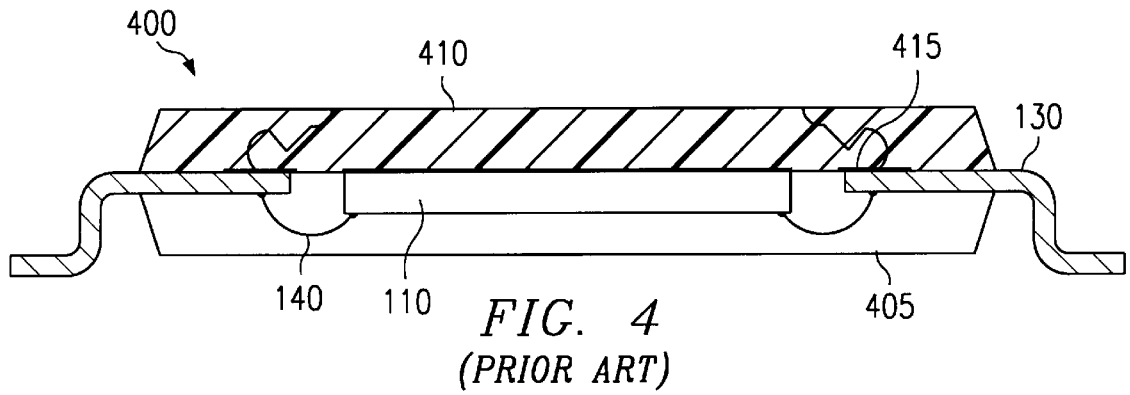
FIG. 4 is a side cross-sectional view of an integrated circuit package of the prior art incorporating a heat sink.
Figure 5:
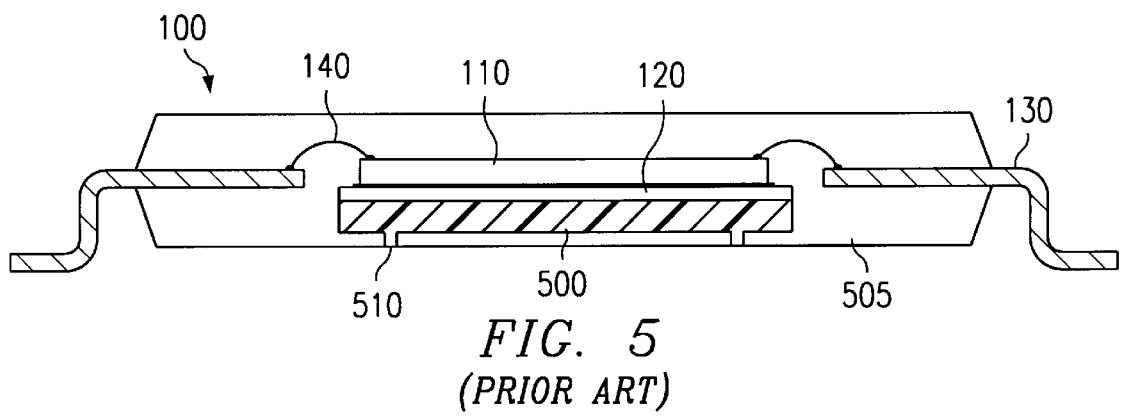
FIG. 5 is a side cross-sectional view of an integrated circuit package of the prior art incorporating a drop-in heat spreader.
Figure 6:
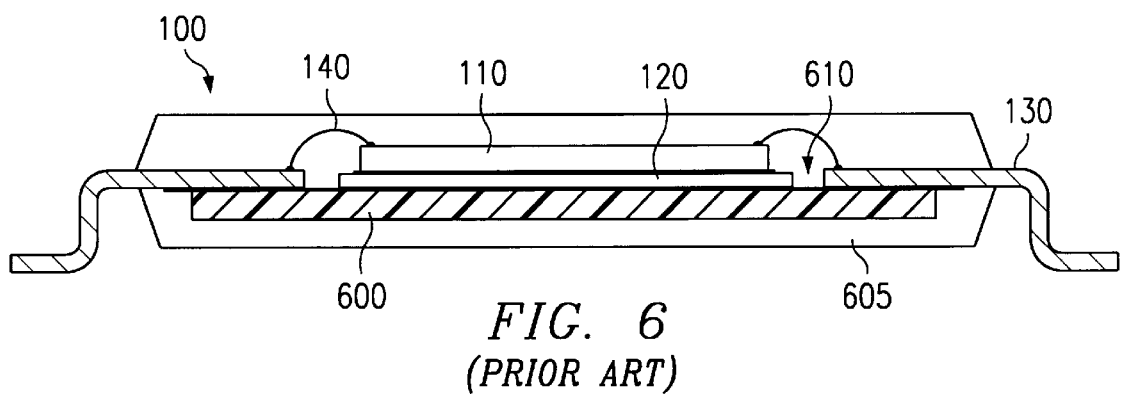
FIG. 6 is a side cross-sectional view of an integrated circuit package of the prior art incorporating a heat spreader in thermal contact with the leadframe.
Figure 7:
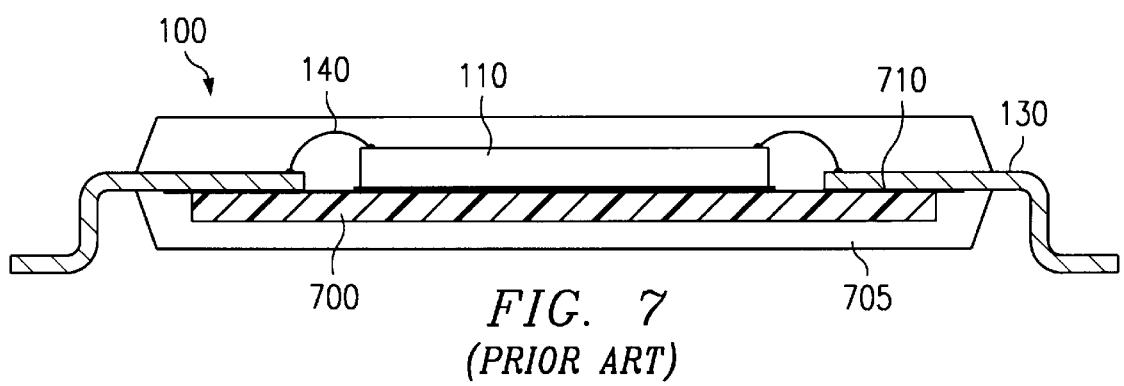
FIG. 7 is a side cross-sectional view of an integrated circuit package of the prior art incorporating a heat spreader.
Figure 8:
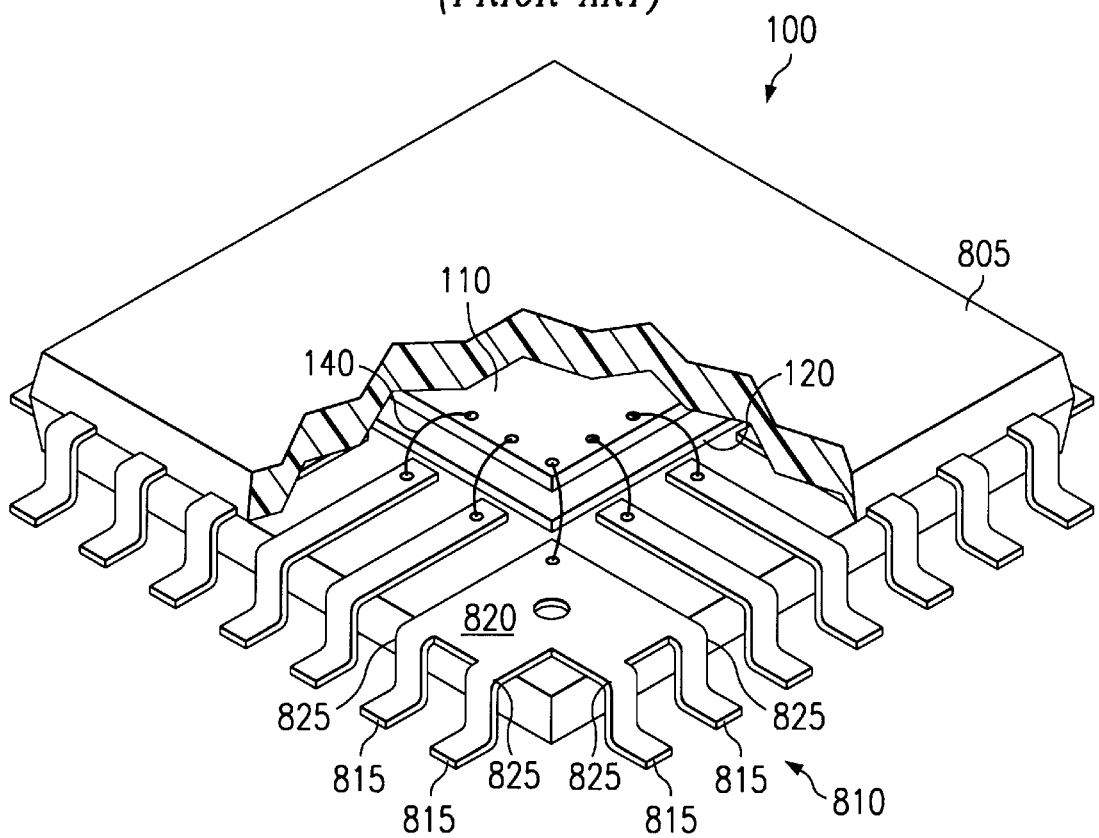
FIG. 8 is a cut-away perspective view of an integrated circuit package of the prior art incorporating a "bat-wing" heat conduction surface.
Figure 12:
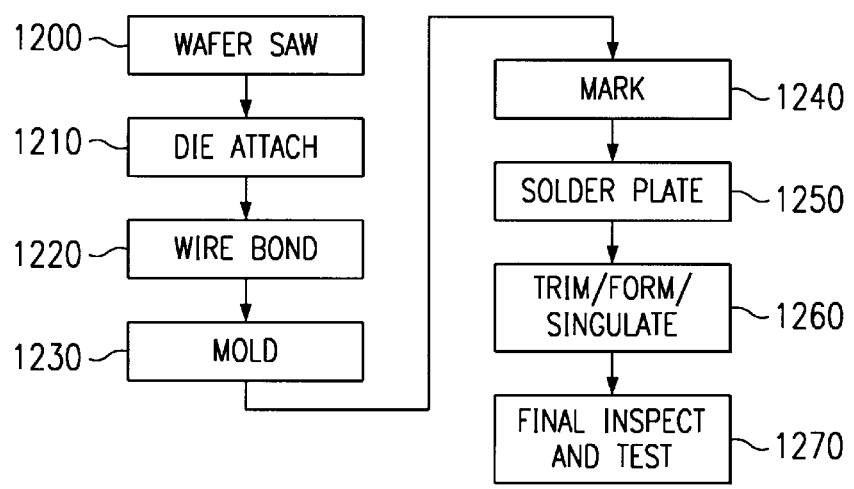
FIG. 12 is a flow chart showing steps in fabricating one embodiment of the present invention.

FIG. 12 is a flow chart showing steps in fabricating one embodiment of a thermally enhanced integrated circuit package of the present invention. These steps are the same steps required to fabricate a standard, non-thermally enhanced package. Accordingly, the same processing facilities used to fabricate standard packages can be used to fabricate thermally enhanced packages of the present invention. The fabrication proceeds as follows. At step 1200, an incoming wafer of integrated circuits is inspected and sawed into separate dice. At step 1210, a die is attached to the die pad. At step 1220, the die is wire bonded to the leadframe. At step 1230, the die, diepad, and leadframe are encapsulated in a plastic mold compound. At step 1240, the molded package is marked with identifying markings. At step 1250, the exposed pins and webs are solder plated. At step 1260, the package is deflashed, trimmed, formed and singulated. The package is finally inspected and tested at step 1270.

Thus a novel thermally enhanced integrated circuit packaging has been presented. Although the present invention has been described with respect to certain example embodiments, it will be apparent to those skilled in the art that the present invention is not limited to these specific embodiments.

I claim:

1. A thermally enhanced integrated circuit packaging system comprising:

a die pad;

an integrated circuit die in thermal communication with said die pad;

a leadframe comprising a first plurality of electrically and thermally conductive pins adjacent to said die pad, each of said conductive pins having first and second ends;

a second plurality of said conductive pins being thermally connected to said die pad;

a thermally conductive web joining said first ends of a third plurality of said conductive pins; and a thermally conductive heat transfer channel joining said second ends of a fourth plurality of said conductive pins, wherein said thermally conductive heat transfer channel has a completely enclosed cut out portion to anchor said thermally conductive heat transfer channel.

2. The integrated circuit packaging system of claim 1 further comprising a molded body generally encapsulating said integrated circuit die and said die pad.

3. The integrated circuit packaging system of claim 1 wherein said third plurality of conductive pins comprise ground pins.

4. The integrated circuit packaging system of claim 1 wherein said third plurality of conductive pins comprises pins from a set of pins comprising ground pins and unused pins.

5. The integrated circuit packaging system of claim 1 wherein said integrated circuit package is a Thin Quad Flatpack Package.

6. The integrated circuit packaging system of claim 1 wherein said heat transfer channel comprises a thin, heat conductive metal alloy.

7. The integrated circuit packaging system of claim 1 wherein said web comprises a thin, heat conductive metal alloy.

8. The integrated circuit packaging system of claim 1 wherein said heat transfer channel is integrally formed with said fourth plurality of conductive pins.

9. The integrated circuit packaging system of claim 1 wherein said web is integrally formed with said third plurality of conductive pins.

10. The integrated circuit packaging system of claim 1 further comprising:

a printed circuit board comprising a surface comprising a thermally and electrically conductive trace, a portion of said trace comprising a heat dissipative surface;

said web mounted to said trace such that said web is in thermal communication with said trace.

11. The integrated circuit packaging system of claim 10 wherein said trace comprises a ground plane.

12. A thermally enhanced integrated circuit packaging system comprising:

a die pad;

an integrated circuit die in thermal communication with said die pad;

a leadframe comprising a first plurality of electrically and thermally conductive pins adjacent to said die pad, each of said conductive pins having first and second ends;

a second plurality of said conductive pins being thermally connected to said die pad;

a thermally conductive web integrally formed with said first ends of a third plurality of said conductive pins;

a thermally conductive heat transfer channel integrally formed with second ends of said third plurality of said conductive pins;

a printed circuit board comprising a thermally and electrically conductive trace, a portion of said trace comprising a heat dissipative surface; and said web mounted to said trace such that said web is in thermal and electrical commnunication with said trace, wherein said thermally conductive heat transfer channel has a completely enclosed cut out portion to anchor said thermally conductive heat transfer channel.

13. The integrated circuit packaging system of claim 12 wherein said third plurality of pins comprises pins from a set of pins comprising ground pins and unused pins.

\* \* \* \* \*